March 15, 1966 R. D. BRAND 3,241,072

TUNING CONTROL SYSTEM

Filed Oct. 16, 1962 4 Sheets-Sheet 1

INVENTOR.

ROBERT D. BRAND

BY Eugene M. Whitacre

ATTORNEY

March 15, 1966 R. D. BRAND 3,241,072

TUNING CONTROL SYSTEM

Filed Oct. 16, 1962 4 Sheets-Sheet 2

INVENTOR.
ROBERT D. BRAND

BY Eugene M. Whitacre

ATTORNEY

INVENTOR.
ROBERT D. BRAND
BY Eugene M. Whitacre
ATTORNEY

INVENTOR.
ROBERT D. BRAND

BY Eugene M. Whitacre

ATTORNEY

United States Patent Office 3,241,072

Patented Mar. 15, 1966

3,241,072

TUNING CONTROL SYSTEM

Robert D. Brand, Lawrence, Ind., assignor to Radio Corporation of America, a corporation of Delaware Filed Oct. 16, 1962, Ser. No. 230,897

22 Claims. (Cl. 325—459)

The present invention relates to tuning systems for television receivers of the type wherein a higher-frequency tuner is combined with a lower-frequency tuner to cover two television broadcast signal bands, such as the present very-high-frequency and ultra-high-frequency (VHF and UHF) bands.

In television receivers adapted to receive both VHF and UHF broadcasts, the VHF tuner is generally of the rotary preset channel-tuning type covering, for example, the twelve broadcast channels (2–13) in the present lower-frequency VHF band. The tuner may include a rotary tuning control element, such as a control shaft, movable in steps progressively through a plurality of detent-controlled, angularly-spaced, channel-tuning or stop positions over a full rotational range of movement in either direction by manual or motorized control means connected therewith.

The associated UHF tuner is generally of the rotary continuous-tuning type covering the seventy broadcast channels (14–83) in the present higher-frequency UHF band. Tuners of this type include a rotary tuning control element, such as a control shaft for continuous rotational tuning movement of less than one full rotation of the shaft.

More particularly, in some aspects, the present invention relates to a programming and tuning control system for television receivers of the above two-band or VHF-UHF type, wherein the VHF and UHF tuners may be preset or pretuned for desired VHF and UHF signal channels which are programmed and readily selectable by manual as well as motorized and remote control means.

It is an object of this invention to provide an improved programming and tuning control systems for two-band television receivers and the like, wherein a plurality of desired signal receiving channels may be pretuned and programmed for simplified manual as well as motorized and remote control selection.

In a combined VHF-UHF television receiver, for example, the television channels selectable may be all UHF, all VHF or any combination of VHF and UHF channels, and totaling any number desired. However the twelve VHF stops with interposed UHF channels are presently indicated as being sufficient for normal operation in any television service area, although more or less may be provided as required.

It is also an object of this invention to provide a combination two-band tuner for a television receiver of the VHF-UHF type which provides rotary step-type preset tuning for UHF as well as VHF signal channels, and for both manual and remote control operation with detent-controlled channel tuning stop positions, and wherein the signal selecting circuits are tuned to preselected signal channels in either or both bands, intermixed and/or in any desired sequence.

It is, therefore, a still further object of this invention to provide an improved programming and tuning control system for two-band television receivers of the VHF-UHF type, wherein the tuning elements of two tuners may be moved jointly and effectively in unison in a rotational sequence in either direction, and through the medium of a single rotary control shaft and a single rotary turret means, for presetting the VHF fine tuning and the UHF channel tuning, and for programming the tuning band selection and channel tuning stops.

In accordance with one embodiment of the invention, a VHF tuner of the rotary preset channel type having a plurality of detent-controlled, angularly-spaced, channel tuning stop positions and covering, for example, channels 2–13 of the present VHF band, is provided in close operating relation to a UHF tuner of the rotary continuous-tuning type covering channels 14–83 of the present UHF band, and including an operating lever or arm movable through a limited angular range for full frequency coverage of the UHF band. The VHF channel tuner is provided with a rotary tuning control shaft which is controlled in a sequence of preset tuning stop positions in one full 360-degree turn, by suitable resilient detent means. The detent means may be of the type having a resilient stop element which is displaced against spring tension as the tuning shaft is adjusted through the rotational steps or channel tuning stop positions of the tuner.

Both tuners are preset or otherwise tuned at the same stop positions in a rotational sequence as determined by the rotation of the one VHF tuner shaft. Thus the only detenting means required for the tuning stop positions is that in the VHF tuner. Further in accordance with the invention, a single rotary turret means of the type having a peripheral row or circle of adjusting means such as screws, and as generally provided for presetting the VHF fine tuning, may also be used to tune the UHF channels. The VHF or UHF selected channel signals are applied to the receiver circuits depending upon the selected position of band-switching or programming means at or corresponding to each tuning stop position.

The turret adjusting means may provide for band-switching or programming, or separate means may be used. In any case the programming means includes adjustable elements for actuating switching means for selectively applying the signal output of the VHF tuner or of the UHF tuner to the following I.F. amplifier and the other signal translating circuits of the television receiving system, thereby to select the signal band and preset channel at which the receiver operates at each tuning stop.

Selected UHF channels may be interposed in the VHF channel tuning sequence at unused VHF stop positions, and the selective band switching may include switching the VHF tuner to provide preamplification of the I.-F. signals for the UHF band. In the present system this tuner switching may be provided or a separate I.-F. amplifier may be used as a preamplifier for the I.-F. signals, thereby to adapt the programming and tuning control system of the present invention more readily to any existing VHF-UHF television receiver.

Further features of the programming and tuning control system of the present invention which may be included, if desired, are single dial tuning indicator means for both UHF and VHF channel tuning, manual operation of both tuners for all UHF and VHF channels with one channel selector and one fine tuning knob or like control element, and one tuning control shaft, which is the VHF tuner shaft. For remote control or motorized operation only one motor element is then required for both tuners, and likewise for remote control or motorized operation, only one set of control switches and operating elements therefor are required.

The motion required for switching the tuners, that is, the operating movement of associated band-selector switch means, is provided by the programming means which may be part of the turret element and connected with the VHF tuner control shaft and its detenting means. Individual programming elements effective at each stop position may include, for example, a two-position cam or pin element for each VHF or channel tuning stop position of the control shaft, effective to operate or to bypass the selector switch means. Alternatively, and by way of example, the adjusting means or tuning screws in the rotary turret may be moved to one position for actuating the selector switch means as desired for each channel stop position. The tuning system may thus be operated to select a UHF channel or a VHF channel because of the joint control of the two tuners and pretuning of desired UHF channels. The programming of the two bands then depends upon the selected position of the programming element at each tuning stop position.

When the VHF tuner control shaft is adjusted between the same stops or stop positions, the single turret element with one set of tuning screws or adjusting means effectively provides (1) for fine tuning the VHF channels which are already preset, and (2) tuning in or presetting an UHF channel, and the signal output of the receiver depends upon the selected position of the programming element for the band switching at each stop position. The same tuning screws or adjustable elements of the turret may also have (3) programming functions in a remote or motorized control system. For example, if neither a UHF or VHF channel is desired at any tuning stop position, the tuning screw or element for that position can be moved to definite operational positions one of which is to actuate a control switch for the motor means of the system thereby to move or program the tuner to the next stop position or a position for the next desired channel.

The details of the present invention will be better understood from the following description of certain embodiments thereof when considered in connection with the aaccompanying drawings.

In the drawings, FIGURE 1 is a front view of a combined VHF/UHF television receiver provided with a programming and tuning control system embodying the invention;

Figure 4:
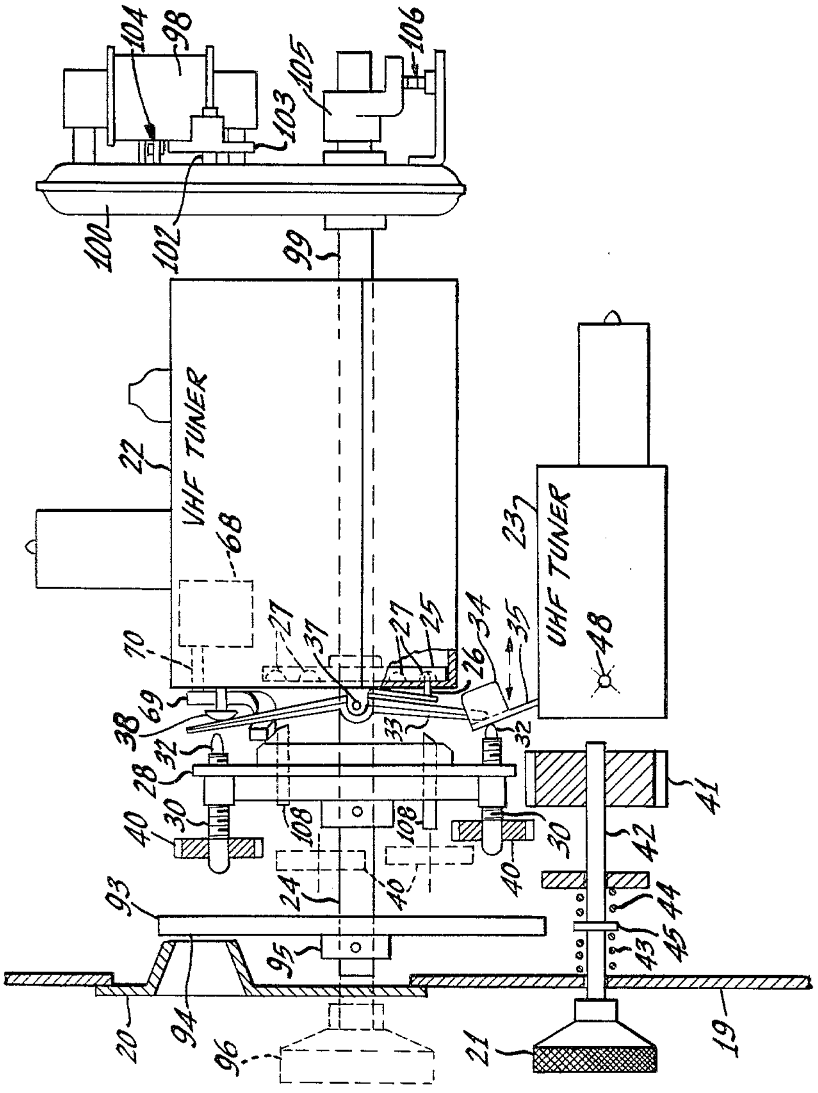
FIGURE 4 is an enlarged side view, partly in section, of the programming and tuning control system of the receiver of FIGURE 1, taken on section line 4—4 thereof, and showing the operational relation of tuning and control means therefor in accordance with the invention.
Figures 6, 7:
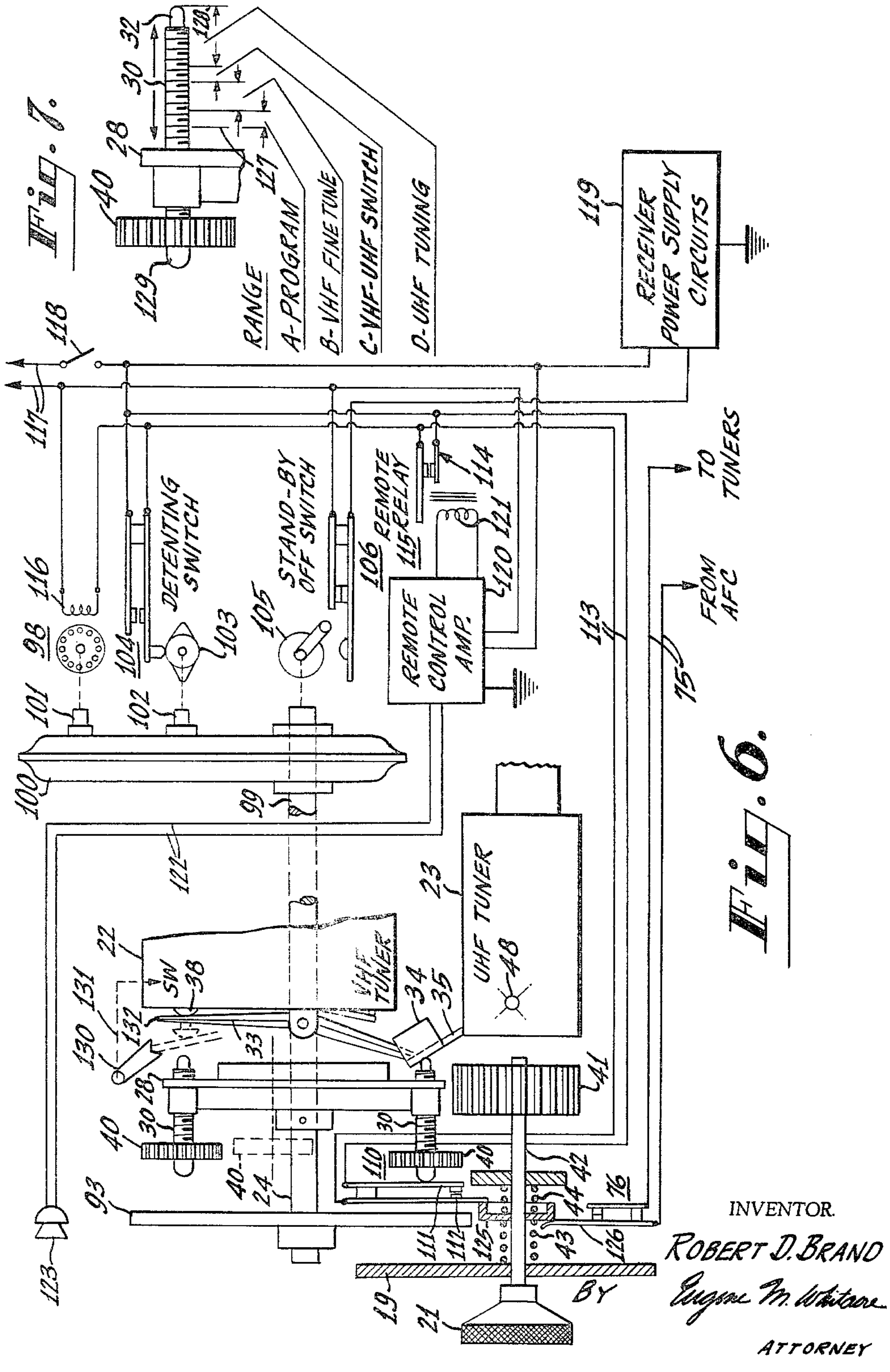
FIGURE 6 is a further enlarged side view, partly in section, of the tuning and control means as shown in FIGURE 4, further modified and including a schematic circuit diagram for the motorized and remote control operation of the system.
FIGURE 7 is an enlarged detailed side view of a tuning adjustment element shown in FIGURE 6, illustrating certain operating positions thereof in accordance with a further modification of the invention.
Figures 8, 9:
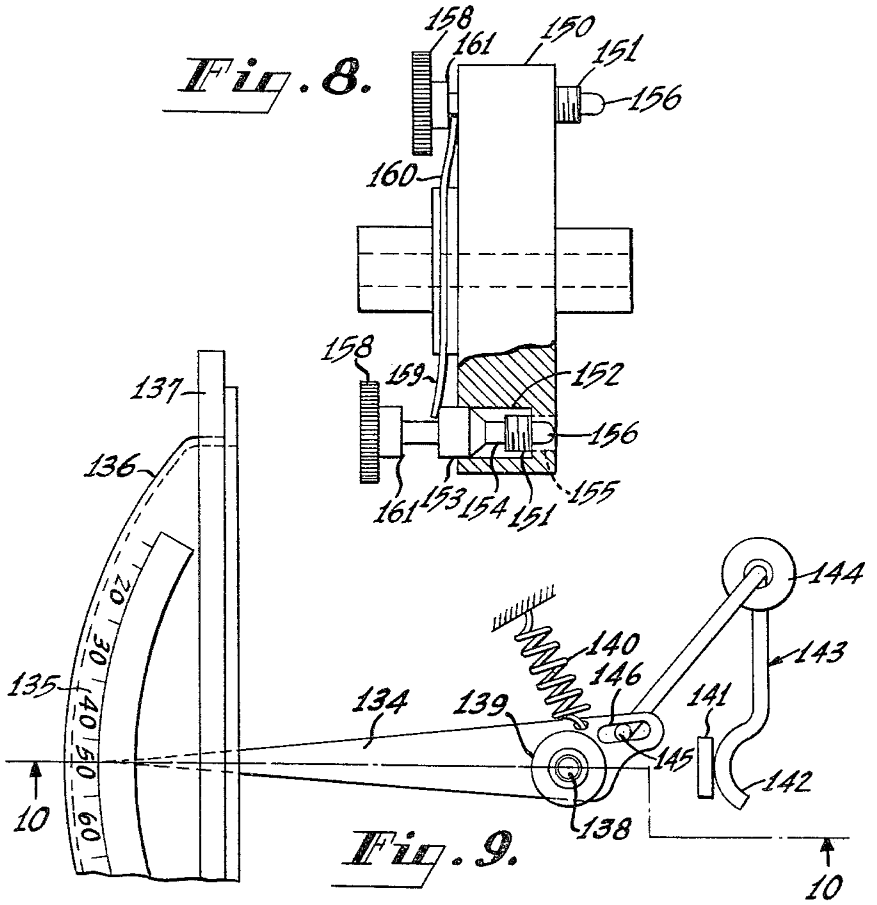
Figure 10:
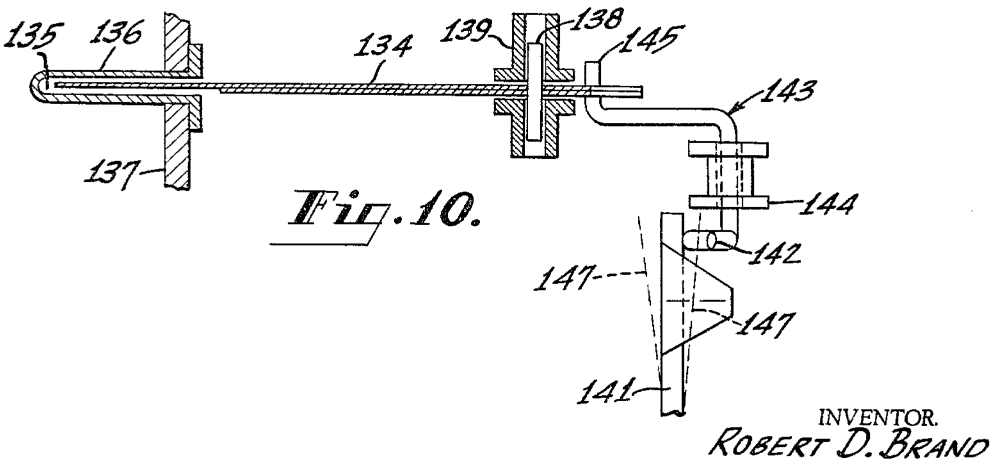

FIGURE 8 is a side view, partly in section, of a tuning turret element as shown in FIGURES 4 and 6, illustrating a modification thereof in accordance with the invention; and, FIGURES 9 and 10 are top and side views, respectively, of tuning indicator means adapted for use in the programming and tuning control system in accordance with the invention, FIGURE 10 being partly in section and taken on the section line 10—10 of FIGURE 9.

Figure 1:
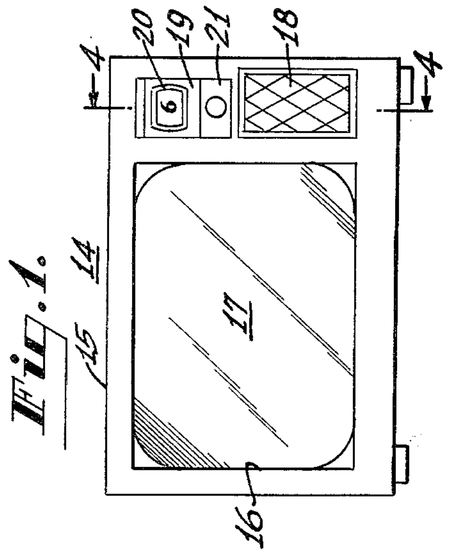

Referring to the drawings, wherein like elements and circuits are designated by like reference characters throughout the various figures, and referring particularly to FIGURE 1, a combined VHF–UHF television receiver 14 for which the invention is adapted, may be of any suitable type such as a table model shown, having a casing 15 in which is located the usual frontal viewing opening or window 16 for the face of a kinescope or picture tube 17 together with a grilled loudspeaker opening 18 and an operating panel 19. The latter includes an escutcheon 20 which provides a tuning indicator window through which the channel selection or tuning setting of the receiver may be observed as indicated, being that of VHF channel 6 in the present example. The operating panel 19 is also provided with a single rotatable tuning control element or knob 21, as shown, which is connected with the internal operating mechanism of the programming and tuning control system as will hereinafter be described.

Referring now to FIGURES 2–5 inclusive, along with FIGURE 1 it will be seen that the tuning system of the television receiver, in rear of the control panel 19, includes a VHF or lower-frequency tuner 22 and a UHF or higher-frequency tuner 23 suitably positioned and mounted with respect to each other, whereby they may be incorporated into a unitary VHF–UHF or two-band tuning control system for operation by one manual control element such as the control knob 21.

The VHF tuner 22 is of usual detent-controlled multistop rotary switch type for channel selection, and wherein the signal selecting circuits are tuned to preselected television broadcast channels, such as channels 2–13 of the present VHF television band. The VHF tuner is provided with a main tuning control shaft 24 for the system, which extends therethrough and is rotatable through a full 360-degree turn in thirteen equal steps, or angularly-spaced channel tuning stop positions in the present example. To establish the tuning stop positions of whatever number required, suitable detent means may be provided in connection with the tuning control shaft.

As shown by way of example (FIG. 4), the detent means may be incorporated in the VHF tuner and may comprise a rotating detent disc 25 attached to the shaft 24, and provided with a resilient detent or stop element 26. The latter is displaced against spring tension in connection with corresponding spaced detent notches 27 in the disc as the tuner is adjusted from one stop position to another. The detent means shown represents any suitable means of this type for resiliently stopping or holding the single tuning control shaft of the system, or the VHF tuner shaft in the present example, in any one of the channel tuning stops positions, and in an additional position in the present tuner construction.

The tuning control system further includes a multi-position rotary turret 28 which is mounted on the forward end of VHF tuning shaft 24, between the tuner and the panel 19, in the present example. This turret is similar to those normally provided for VHF fine tuning and carries a plurality of rotatable fine-tuning or tuning adjustment screws or elements 30, extending through the turret in a circular row near the periphery thereof and angularly spaced and in parallel relation to each other, as indicated. In the present example, for the present VHF band it may be considered that there are twelve tuning adjustment elements in the row which also includes a blank or additional position, indicated at 31 in FIGURE 5. This position may be used for the Standby-Off position of the tuning system for remote or motorized control as will hereinafter appear.

As the turret 28 rotates with the tuning shaft 24 through the various tuning positions of the VHF tuner for channels 2–13, the rearward or operating tips 32 of the tuning screws progressively come in contact with one end of a fine tuning control lever 33 and the winged outer end 34 of a tuning control lever or arm 35 for the UHF tuner. Both levers or arms are thus joined one against the other, for joint operation by the tuning screws as they come into the lower position shown in FIGURE 4, in their rotational sequence with the VHF tuner and control shaft 24.

In the present example, the tuning lever or arm 35, or the winged tip 34 thereof, directly contacts the tuning adjustment screw tips and transmits the motion imparted thereto also to the fine tuning lever 33 which is in contact therewith. The positions of the ends of the levers may be reversed if desired for actuating both levers through direct contact by the screw tips with the fine tuning lever 33, with the lever or arm 35 in rear thereof.

The fine tuning lever 33 is spring loaded so that it presses at one end against the tuning screws and pivots about a fulcrum point or axis indicated by the pivot pin 37 in FIGURE 4, on the tuner 22. A spring-loaded fine-tuning plunger 38, connected with internal VHF fine tuning means (not shown) is in contact with the opposite end of the tuning lever 33, as indicated in FIGURE 4, and is thus moved in response to movement of the lever, to control the VHF fine tuning.

The heads 40 of the tuning screws 30 are pinion gears which, when turned clockwise or counterclockwise by a tuning gear 41 move in or out with respect to the turret and the joined ends of the tuning levers 33 and 35, and thus adjust the fine tuning of the VHF tuner, and the tuning and fine tuning of the UHF tuner at each stop position, as will hereinafter appear. As indicated in FIGURE 4 the tuning gear 41 is mounted on a rotatable and axially movable control shaft 42 which passes through the panel 19 and is connected with the outer control knob 21. The gear and shaft are movable by the knob from the rest or reference position shown, axially in either direction against the holding force of centering means such as two coiled compression springs 43 and 44 surrounding the shaft 42 on opposite sides of a fixed collar 45 on the shaft. As will be seen from the fragmentary view of FIGURE 5, the tuning adjustment screws 30 are equally spaced in a circle about the turret axis.

When moved forwardly, the tuning gear 41 meshes with the gear heads 40 as they move with the turret in a circular path 47 successively into position to engage and move the tuning control arms. Rotation of the control knob 21 then serves to rotate the respective gear heads for setting the tuning of each UHF channel or for setting the fine tuning for each VHF channel.

The UHF tuner 23, in the present example, may be considered to be of the rotary variable, or continuously-tunable, type having an operating or tuner shaft 48 to which is connected the operating arm 35 for imparting rotary tuning movement thereto in a full tuning range through the UHF band of less than 180 degrees. The UHF tuning lever 35 presses against the tuning screw in the turret which is in the operating position at any time. Adjusting the tuning screw thus moves the tuning lever 35 which rotates the tuning means in the UHF tuner to any desired channel setting in the UHF band.

The VHF fine tuning lever, also spring loaded, presses against the rear side of the winged outer end 34 of the UHF tuning lever 35. The VHF and UHF tuning levers thus bear against the same tuning screw or tuning element and travel or move in conjunction with one another. However, only one of the levers or tuners is used or active for control at any one time, depending upon the position of the band-switching or programming means. The number of receiving channels that may be set up may include all twelve of the VHF channels or up to twelve UHF channels, or any combination of UHF or VHF channels totaling the number of stop positions in one rotational turn of the main tuning control shaft 24.

The two tuners are thus movable jointly and effectively in unison to the same stop positions in a rotational sequence in either direction. The mechanical operating means include a single rotary turret with a single peripheral row or circle of adjustable tuning elements or screws for presetting the VHF fine tuning and the channel tuning of the UHF band, and the only detenting means required is that provided in connection with the VHF tuner.

Figure 2:
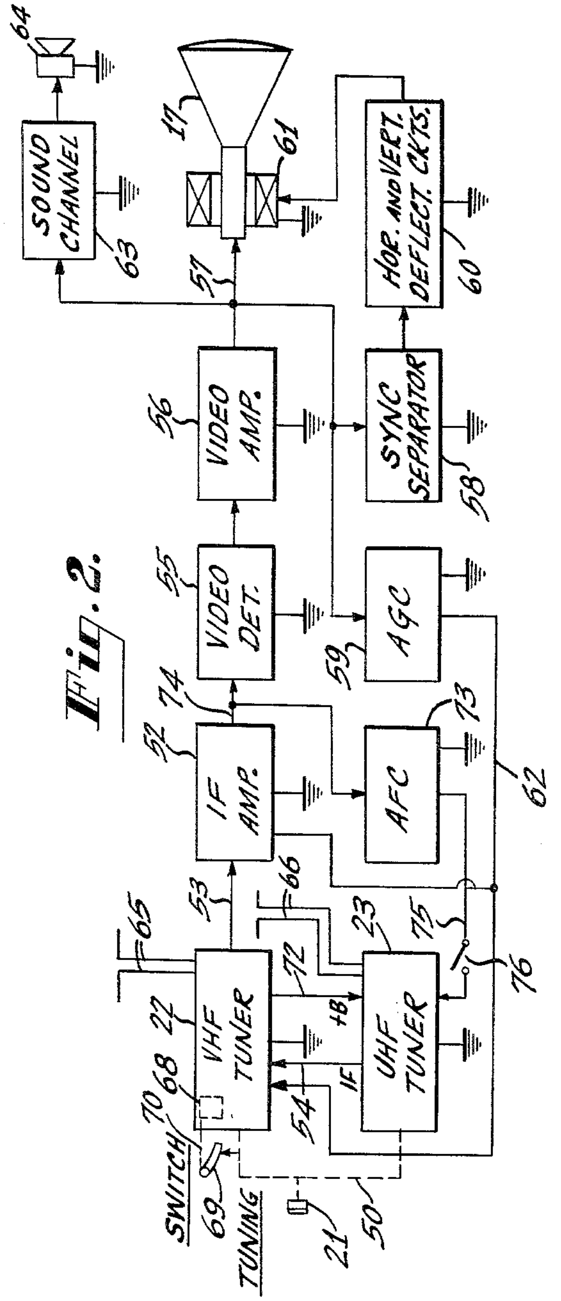
FIGURE 2 is a schematic circuit diagram, in block form, of the television receiver of FIGURE 1 showing the operating elements and circuit connections therefor in accordance with the invention.

The above operating or tuning control connections for the two tuners is indictaed in the circuit diagram of FIGURE 2 by the dotted line connection 50. Also as indicated, the VHF tuner 22 is connected to apply I.-F. output signals to the I.-F. amplifier 52 through an output connection indicated at 53. The VHF tuner also is connected to receive I.-F. output signals from the UHF tuner through a signal input connection therewith indicated at 54. The I.-F. signal output from the UHF tuner is amplified in the VHF tuner, when connected as an I.-F. amplifier 52, as will hereinafter be described.

Connected with the I.-F. amplifier 52 are the remainder of the signal-translating circuits which may be conventional and follow present commercial practice. By way of example, these include a suitable video detector 55 which is connected to a video amplifier 56. The output circuit 57 of the video amplifier is connected to the kinescope or picture tube 17 and from this circuit signals are also applied to a sync separator 58 and AGC circuits 59 for the receiver. The sync separator is connected to the horizontal and vertical deflection circuits 60 which drive the yoke 61 of the kinescope. The output control voltage from the AGC circuit 59 is connected through an AGC control circuit 62 to the I.-F. amplifier 52 and the VHF tuner 22 in the usual manner, for automatic gain control. The sound channel circuits 63 of the receiver are also connected to the output circuit 57 of the video amplifier and drive the usual loudspeaker or sound reproducing means 64 which is located in rear of the grille 12 in the present example.

Signal input for the two tuners 22 and 23 is applied from suitable signal supply means or antennas 65 and 66 respectively, and the I.-F. signal output from both tuners is through the output connection 53 to the I.-F. amplifier 52. The VHF tuner 22 is switched to the amplifying condition by a suitable two-psition switching means 68 internally thereof as indicated in FIGURE 4, and control means therefor terminating externally of the tuner in a two-position operation element such as a cam or lever arm 69 in the present example, connected with an operating shaft 70 for the switching means.

In addition to switching the VHF tuner from VHF operation to UHF I.-F. amplifier operation, the switching means 68 may also be provided with connections (not shown) for applying +B operating potential to the UHF tuner when the VHF tuner operates as an I.-F. amplifier, this connection being indicated by the circuit connection lead 72 in FIGURE 2. Likewise the UHF tuner may be provided with AFC control potentials under certain operating conditions as hereinafter referred to, through an AFC circuit 73 connected with the I.-F. amplifier output circuit 74 to receive signals therefrom, and having a control circuit connection 75 with the UHF tuner through a control switch 76 shown in its open position in FIGURE 2. The switch is closed to apply AFC potentials to the UHF tuner and thereby aid in the tuning operation under remote control and motorized operation as will be hereinafter described.

The VHF tuner, as an I.-F. amplifier for the UHF tuner as described hereinbefore, serves to add signal gain and selectivity as is desired in the higher-frequency tuning band. However for existing receivers, to which the present invention may be applied, a separate I.-F. preamplifier may be used for this purpose as shown more particularly in FIGURE 3. In this modification, the switch means 77 for VHF and UHF operation by way of example, comprises two single-pole double-throw switch sections external to the VHF tuner but connected to be operated in conjunction therewith as indicated by the dotted connection line 78 with the switch operating cam or lever 69. In the present example the first switch section comprises a first switch arm 79 connected with the I.-F. amplifier 52 and having a first switch contact 80 connected with the VHF tuner I.-F. output circuit 53. A second switch contact 81 is connected to an I.-F. output circuit 82 from an I.-F. preamplifier 83 connected to receive the I.-F. signal output from the UHF tuner 23 through its I.-F. output circuit 54.

The +B operating potential for the tuners is derived from a supply source or lead 85 connected to the second switch arm 86 of the second switch section. This section has a first contact 87 connected to an operating potential supply lead 88 for the VHF tuner and a second contact 89 connected with a similar supply lead 90 for the UHF tuner. The switch arms 79 and 86 are mechanically connected for joint operation as indicated by the dotted connection 91, and are shown each in a position for normal operation of the VHF tuner as a signal supply source for the television system. When the operating connection means 78 is moved by the lever arm 69 to operate the selector switch means and carry the switch arm 79 to the contact 81 and the switch arm 86 to the contact 89, the VHF tuner is deenergized and the UHF tuner is energized with operating potential. At the same time the I.-F. amplifier 52 is switched from the VHF tuner output connection 53 to the I.-F. preamplifier output circuit 82, thereby to receive signals from the UHF tuner. Thus the VHF-UHF switching is provided with a separate I.-F. preamplifier for the UHF band.

A single dial means may be provided to display both the VHF and UHF channel numbers. In the present example this comprises a circular dial plate 93 (FIG. 4) having a forward dial surface 94 movable past the window opening in the escutcheon 20 and having a simple hub 95 by which the plate 93 is mounted on the tuning shaft 24 thereby to rotate in step with the VHF tuner and its detent means. The VHF channel numbers and the UHF channel numbers are applied to the dial surface 94 at each of the stop positions to indicate the television channels, such as channel 6 in FIGURE 1 selected for that stop, either in the VHF or UHF bands. The VHF channel numbers may either be permanent or removable. For the permanent type, the desired UHF channel number is inserted in front of the VHF channel number which it replaces. For the removable type, the VHF number is first removed and then replaced by the desired UHF channel number, in the dial space opposite the viewing window, for each stop position. Any other suitable dial arrangement however may be used if desired.

For manual operation, the dial may be incorporated with a selector knob or other manual control element for the shaft 24 which would extend through the front of the cabinet or operating panel. Thus the control shaft 24 may be extended into connection with an external tuning control knob as indicated in dotted outline at 96 in FIGURE 4. In this case the dial means is maintained within the casing as above described and as shown in FIGURE 4.

For remote control operation, a manual selector knob, such as that indicated at 96, is not required so that the entire escutcheon may be made removable, thereby to provide access to the dial for changing the channel numbers as required. In addition, a single motor 98 is connected with the rear extension 99 of the VHF tuner shaft through a self-contained gear train 100 on which the motor is mounted and through which the tuning shaft extension 99 passes, as shown more clearly in FIGURE 4.

The gear train 100, also shown in FIGURE 6, is driven by the motor 98 through the motor shaft 101. The gear train drives the tuner shaft extension 99 which is effectively the output shaft of the gear train. The gear train has an auxiliary output shaft 102 geared in a ratio of 6½:1 to the main output or tuner shaft extension 99. Mounted on the auxiliary shaft 102 is a two-lobe cam 103 which, in each one-half revolution, closes and then reopens a normally-open detenting switch 104. The timing is such that the switch reopens slightly before each of the 13 detented stop positions of the tuner shaft 24 to insure power cut off from the motor and stopping of the tuners at each position by the detent means. This switch therefore provides for insuring proper detenting action at the stop positions.

Figure 5:
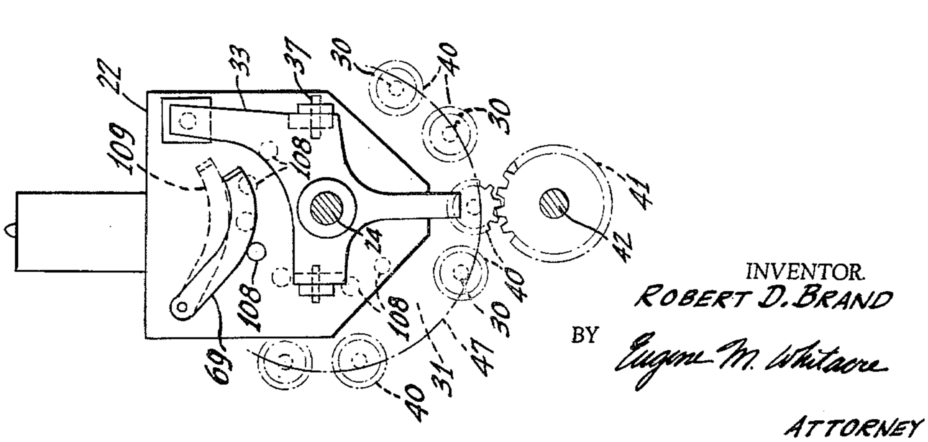
FIGURE 5 is a fragmentary end view, in elevation, of a portion of the control system of FIGURE 4, showing further features and details of construction thereof.

Also connected to the shaft extension 99, or main output shaft of the gear train, is a Standby-Off cam element 105 which operates a normally closed Standby-Off switch 106 in the extra or inactive detent position designated in FIGURE 5 at 31 for example. At the Standby-Off position, the power to the television chassis, or the operating circuits therefor, are interrupted as will hereinafter appear.

The motion required for operating the switch means 68 or 77 and the switch lever 69 or its equivalent in any case, for selecting the VHF or UHF operation, may be provided by any suitable means which may be part of or connected with the single main tuning shaft 24 and which may be actuated at the detented stop positions thereof. By this means the tuner switching is effective to interpose desired preset UHF signal channels in any or all of the VHF channel tuning stop positions. Thus the switching operation may effectively be programmed into the VHF channel tuning sequence at normally inactive VHF tuning stops.

The programming means for the tuner switching operation, in the present example, is turret-operated or controlled and may be made an integral part of the single turret means, for simplified and low cost construction. As shown more particularly in FIGURES 4 and 5, a switch-operating or programming means for actuating the switch lever 69 may include two-position programming pin or cam elements 108, one radially aligned with each tuning screw and arranged in a similar circular path, as indicated and outlined in FIGURE 5. These move in step with the channel tuning into engagement with the switch lever 69, as indicated in solid lines in FIGURE 5, to operate the switch means 68, the arrangement being such that when the switch lever 69 is moved to the alternative position 109, indicated in dotted lines, the switch means operates to provide for UHF tuner operation. This may be done either by switching the VHF tuner as described in connection with the circuit of FIGURE 2 or in switching the two tuners as described in connection with the circuit of FIGURE 3.

The programming pins 108 can be pushed in to engage and operate the switch cam or lever 69 as they move into the operative stop position, or they may be left out so that they move clear of the lever, as indicated by the two examples shown in FIG. 4, others of the pins not being shown for clarity. Thus only the pins which are pushed in serve to operate the switch, and these are selected for the unused or inactive VHF channel tuning stops at which it is desired to interpose pre-selected UHF channels. The angular orientation of a programming pin or element with respect to its corresponding tuning screw is not important as long as there is one pin or element for each tuning screw, and with the same angular spacing.

Figure 3:
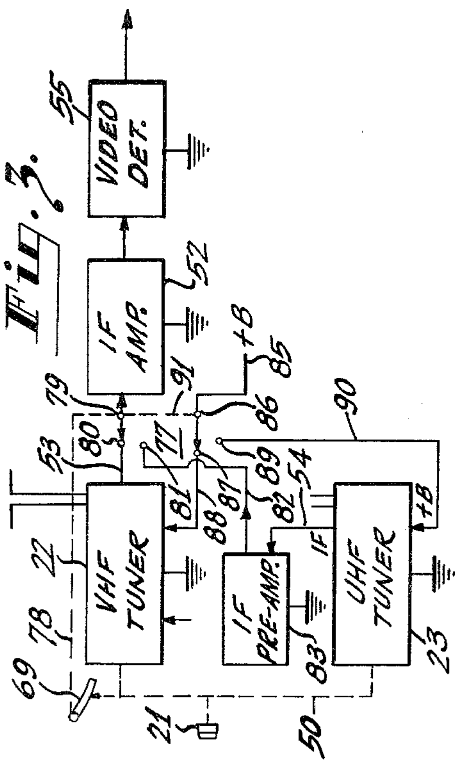
FIGURE 3 is a schematic circuit diagram of a portion of the circuit of FIGURE 2 showing a modification thereof in accordance with the invention.

It should be understood that the switch means of FIG. 3 may be operated in the same manner as shown for the switch means 68 in FIGS. 2, 4 and 5. Thus, a separate I.-F. amplifier for the VHF tuner may be provided as in the circuit of FIG. 3 to achieve the same end result. For application of the system to television receivers in the field, the circuit of FIG. 3 may be used. This is less expensive than replacing the VHF tuner already in the particular television receiver. For factory production of new receivers, however, it is desirable to build the switching circuit into the VHF tuner whereby it may be used as the I.-F. amplifier means for the UHF tuner.

The amplifier switching circuit of FIG. 3 is adapted for use with any VHF-UHF tuner combination. The only switching required for changing any VHF stop position to provide UHF channel operation is to switch the signal input to the I.-F. amplifier or TV chassis from the VHF tuner to the UHF tuner, or its I.-F. pre-amplifier unit, and the power supply +B circuit from the VHF tuner to the UHF tuner. The switch means provided for this purpose, either in the VHF tuner or external thereto, may be actuated by any suitable programming means for imparting motion to the switch operating element, such as the lever or cam element 69 in the present example, at each desired stop position. As hereinafter described, however, it will be seen that the turret tuning screws may be utilized to effect switching of the receiver from VHF to UHF operation.

At each tuning stop position of the tuning system, with the band selector or amplifier switch in the UHF position, the tuning screw normally used to fine tune the VHF channel replaced by that stop position, is then used to tune in or preset-tune any one of the UHF channels (channels 14 through 83) currently available. Thus, with this programming and tuning control system, each adjustable tuning screw or like element can be used to preset fine-tune its normal VHF channel or to preset-tune any UHF channel, depending upon the selector position of the band-switching or programming means.

Referring more particularly to the remote control circuits of FIGURE 6, it will be seen that the tuning screws may also have a third function, wherein if neither a VHF channel nor a UHF channel signal is desired at any channel tuning stop position, the corresponding tuning screw therefor may be moved to one or the other of its limits, such as being retracted fully into the turret. As indicated by the lower tuning screw 30 in FIGURE 6, shown in the operating position relative to the tuning levers 33 and 35, this screw is retracted short of all the way into the turret and just short of the channel programming position. From this position it may be moved all the way to the programming position to engage and close a programming or control switch 110 for the motor means 98. In the present example the front end of the screw causes one movable contact 111 to close with a second contact 112 of the switch. Each of the other screws may similarly be adjusted for closing the switch 110 in the operative position shown. This operaes the motor means to bypass the stop position.

As it will be seen from the circuit diagram, the control switch 110 is connected through circuit leads 113 in parallel with the detenting switch 104 and similar open switch or contact elements 114 of a relay 115. These parallel-connected switches or contact elements are connected in circuit with the operating winding 116 of the motor 98 for individually controlling the flow of operating current thereto from suitable supply lines 117 when an operating switch 118 for the receiver is closed. Also connected with the power supply lines 117, through the operating switch 118, are the receiver power-supply circuits indicated at 119, and a remote control amplifier 120. The power supply circuits 119 are further controlled by the Standby-Off switch 106 in circuit therewith, and the remote control amplifier 120 is directly energized when the power switch 118 of the receiver is closed.

The operating winding 121 of the remote relay 115 is energized by the remote control amplifier with which it is connected, in response to signal pulses applied thereto through an input circuit connection 122 from a control microphone 123. The latter, as is understood, is positioned to receive controlling sonic pulses from a portable remote-control or like sound-producing unit (not shown) for the receiver.

A received sonic pulse at the remote control microphone 123 causes the relay 115 to operate and close the contacts 114, thereby energizing the motor winding 116 when the power switch 118 is closed. The motor then drives the tuning shaft 24 through the gearing 100 and advances the VHF tuner toward the next position. The detenting switch 104 is then closed by the cam 103 in response to operation of the gearing 100 and rotation of the intermediate control shaft 102 through one-half turn or revolution for each movement of the tuning shaft 24 from one stop position to the next. The contacts of the switch 104 thus remain closed, in parallel with the contacts 114 of the remote control relay after the latter have opened, thereby to permit the motor to operate between the stop positions. The contacts of the switch 104 are opened by the cam 103 slightly in advance of each stop position, thereby to permit the movable elements of the two tuners and the turret to be stopped accurately by the detent means with the power to the motor cut off.

In the present system, the common or main tuning shaft 24 is moved from stop to stop position by motor means under control of different switches in circuits and apparatus as above described. Movement of the tuner from one stop position to the next is thus initiated by closure of the relay contacts 114 or closure of the contacts 111–112 of the programming and control switch 110. Closure of the switch 110 by the tuning screws, as described, serves to re-energize the motor at the normal stop position following its normal cut-off by opening of the contacts of the detenting switch 104. The motor drive means then continues to operate and the stop position is thus bypassed.

The switch 110 may also be closed by operation of the control knob 21 inwardly as shown by the present example. An enlarged circular disc 125, of insulating material, carried by the shaft 42 and bearing against the switch contact 112 is thus moved inwardly to close this contact with the contact 111. The motor is energized and thus the tuning may be advanced from stop to stop position by pressing inwardly on the control knob 21, in the modification as shown in FIG. 6.

By this means, the tuning shaft is advanced through the various stop positions and may be brought to the 13th or added position outside the VHF sequence, at which position the cam element 105 on the tuner shaft comes into position to operate the switch 106 and open the contacts thereof. As shown by the circuit diagram, this operates to de-energize the main receiver or power supply circuits therefor, while the remote control amplifier remains energized. Thus, the receiver is maintained in a Stand-by Off condition responsive to push-button control of the control knob 21 or to remote control sonic pulses applied through the microphone pickup device 123 to actuate the relay 115. Closure of the relay contacts 114 or the control switch contacts 111–112 then energize the motor and again cause the tuning sequence to be initiated by moving the tuning shaft to the first stop position which is normally for channel 2 of the VHF band. Operation of the tuner to the other stop positions is as previously described. In moving from the Stand-by Off position, the switch 106 recloses to energize the receiver power supply circuits during the entire movement of the tuning shaft through the active stop positions, when the main power switch of the receiver is closed.

It will be noted that the control knob 21 and its shaft 42 are spring loaded axially in both directions as before described, so that the knob may be pushed inwardly to change channels by closure of the switch 110, as described above, or pulled outwardly and rotated to preset fine-tune the VHF channels and preset-tune the UHF channels. For UHF color reception it may be desirable to incorporate an AFC (automatic frequency-control) circuit to improve the reset ability of the UHF tuner. The AFC circuit may also be used with the VHF tuner and thus eliminate the need for VHF fine tuning means, such as the tuning lever 33 and operating element 38 on the VHF tuner. The individual tuning screws or adjustable elements in the turret may then be used only to preset-tune the channels in the UHF band and provide VHF-UHF programming for the twelve or more stop positions in the operating sequence.

With the AFC circuit as shown schematically in the circuit of FIG. 2, the control switch 76 is used so that the automatic frequency-control means may be disabled when tuning-in the UHF channels. This switch is therefore connected with the fine-tuning means and the control knob 21 in the present example, whereby when the knob is pulled outwardly for engaging the tuning gear 41 with the gearheads 40 to tune-in or preset a desired UHF channel, the switch 76 is opened to interrupt the application of AFC control potentials to the UHF tuner, thereby facilitating the tuning. To this end the switch 76 is positioned so that one contact element 126 is moved by the disc 125 to open the switch 76 as the knob 21 is pulled outwardly as above described.

A second method for providing the necessary programming or switching of the tuning operation of VHF-UHF receivers, which does not require a separate programming means such as the two-position cam or pin elements, involves the tuning screws alone and the use of different positions of the tuning screw travel to provide the necessary functions.

In this method, the tuning screws 30 are provided with a total axial range of movement or travel of predetermined length and functional composition, as illustrated in FIG. 7 to which attention is now directed along with FIG. 6. In a total range of travel or movement of one inch, for example, between a full-out position indicated by the line 127, to a full-in position represented by the line 128, the different positions or functional composition of the total range, may be set up as follows:

(1) The first ⅛ inch of travel, starting at the full-out position 127, may be used to program out or by-pass undesired channel stop positions. This is indicated as the "A" or "Program" range, in which the tuning screw forward ends 129 are positioned to engage and actuate the contact 111 of the program or channel-change switch 110 at each operative stop position, as hereinbefore described for the normal tuning screw operation.

(2) The next ¼ inch of travel, indicated as the "B" or "VHF Fine Tune" range, may be used to provide for moving the VHF fine tuning lever 33 to adjust or preset the VHF fine tuning at each desired VHF channel tuning stop. In this range, the UHF I.-F. amplifier switch is not operated nor is the UHF tuner lever 35 contacted, as the tuning levers may be transposed as hereinbefore described.

(3) The next ⅛ inch of travel, designated as the "C" or "VHF-UHF Switch" range may be used to operate the VHF-UHF programming switches 68 or 77.

In this range, the switch operating element in either case may be a pivoted lever 130 connected to operate the switch means as indicated by the dotted line 131 and positioned to be engaged and moved by the free end 132 of the fine tuning lever 33 during the movement of each active tuning screw in this range. The free end of the switch operating lever 130 may be square notched or otherwise formed for two-position or flip-flop operation as indicated. Thus as the free end 132 of the fine tuning lever 33 moves in one direction, in a position as indicated by dotted outline, the notched end of the lever 130 is engaged and moved to operate the switch. The lever 130 is likewise retracted in the opposite direction upon the return movement of the lever 33, to reset the switch. This action is such that it operates the switch in one direction to provide for UHF signal reception at any tuning stop or to restore the normal VHF signal reception at any tuning stop when moved in the opposite direction.

(4) The final ½ inch of travel, designated as the "D" or "UHF Tuning" range, may be used for UHF tuning or channel preset, at which time each active tuning screw operates to move the tuning lever 35 of the UHF tuner through its operating range to a desired frequency setting or channel, while the VHF fine-tuning lever moves clear of the fine-tuning control element or plunger 38 of the VHF tuner.

In this modification, therefore, each tuning screw provides its own programming for the full tuning operation. For manual operation, however, it will be seen that the first ⅛ inch of travel may be eliminated in the VHF fine tuning range. However, manual operation is contemplated as necessary only when the motor means would be out of operation temporarily. Therefore for motorized or remote control operation a manual selector knob, such as the knob 96, is not required. Thus the escutcheon 20 may be made removable whereby access may be had to the dial fact 94 for readily changing the channel numbers as required.

Because of the high operating frequencies involved in the tuning of the UHF channel, a relatively high degree of rigidity is required in the construction of the tuning adjustment means used in conjunction with the UHF tuner. For example, very little play or wobble is tolerated between the turret or mounting means 28 and the movable tuning adjustment elements, or screws 30 mounted therein, as this affects the reset of tuning in the UHF band as each tuning screw comes into engagement with the operating levers and moves or sets the UHF tuning lever. In a turret construction where the tuning screws are relatively long and deeply supported in the turret by suitable bearing elements as indicated, for example, in the turret structure of FIGURES 4 and 6, tuning inaccuracy in the UHF band, that is, at the selected UHF channel stops is substantially reduced and does not present a problem.

However, an improved turret and tuning-screw construction for television tuners of this type, having a high degree of rigidity in operation, is shown in the modification of FIG. 8, to which attention is now directed more particularly.

Here a wide bearing for tuning screws 151, corresponding to and for the same purpose as the tuning screws 30, is provided by the modified and relatively thick rotary turret 150, the screws being arranged in circular formation about the periphery of the turret as in the prior example. In this modification, however, a counter-bored hole 152 at each screw location is provided in the turret and is reamed or otherwise finished to exact size so that it has a close fit with a shoulder or cylindrical section 153 of larger diameter than either the main screw or thread section 151 or the main body or shank 154 thereof. The inside diameter of a threaded portion 155 of the turret provided for receiving each tuning screw, in rearward axial extension of the counterbored hole 152, is also reamed or carefully adjusted so that it has a close fit with the smaller-diameter shank or main body of the screw as between the ball end 156 and the thread section 151 and between the thread section and the shoulder section 153. Thus the tuning screw structure in each case always has a close tight fit with the turret, being accurately guided and supported at both its forward and rearward ends substantially throughout its full range of movement axially.

Assuming that the screw threads on the tuning screws are of the usual right-hand type, rotating a tuning screw by means of the gear head 158 in a counter clockwise (CCW) direction will retract the screw into the turret, or to the left as viewed in FIG. 8. At a point where the thread section 151 is still engaged in the threads 154 by at least one full thread, a free end of a flat leaf-spring element 159, fixedly mounted on the turret as indicated, comes in contact with the forward end of the shoulder section 153 and tends to push the tuning screw to the right, as viewed in the drawing, with respect to the turret. Further CCW rotation of the tuning screw disengages the thread section 151 thereof completely from the internal threads 154 of the turret opening, but the spring element or lead 159 always maintains a slight amount of pressure on the screw so that clockwise (CW) rotation of the tuning screw will start the thread section 151 thereof into the turret threads 154. One such spring element or leaf may be provided for each tuning screw.

As the tuning screw is further rotated clock-wise (CW), the thread section 151 advances into and completely through the threads 154. While one thread is still engaged, the spring element 159 comes in contact with a second shoulder 161, spaced from the first, and provided on the screw structure. Presently it is provided, as shown, in connection with the tuning gear 158 as a hub element therefor. The contacting position, above described, is shown more clearly by the upper tuning screw of FIG. 8 wherein the shoulder 161 engages the free end of a second spring element or leaf 160, integral with the spring element 159. This tends to push the tuning screw to the left, as viewed in the drawing, with respect to the turret. Further clock-wise rotation of the tuning screw causes the thread section 151 of the screw to disengage from the turret threads but the spring leaf 160, in the present example, keeps it in contact with the threads in the turret, whereby CCW rotation will restart the thread section 151 into the threaded portion of the turret opening. With this construction, normal screw threads of standard pitch may be used without binding when they reach the end of their travel and without undesired wobble.

When tuning-in or presetting desired signal channels in the UHF band, that is, when adjusting the tuning screws 30 to operate the UHF tuner 23 by means of the control knob 21 and tuning gear 41 at selected stops, it is desirable, for greater ease of tuning and channel setup, to have tuning indicator means, with a frequency or like scale provided for the UHF band. As shown in FIGURES 9 and 10, improved and simplified tuning indicator means for this purpose may be provided as a feature of the present system. This includes a movable pointer or indicator 134 and associated indicator scale 135 operating in conjunction with the UHF tuner. The tuning indicator scale 135, which may be suitably calibrated is enclosed in a translucent plastic casing 136 or the like which may be mounted in a panel or like frontal element 137 of the receiver casing. The indicator or pointer 134 is pivoted to move on a pivot pin 138 carried in a fixed bearing element 139 and moves against the retracting force of a coiled tension spring 140, as indicated in FIG. 9.

In the present example, the pointer 134 is driven by the UHF tuning lever 35 in modified form, as shown at 141, which bears against one (lower) arm 142 of a pivoted connecting link or two-armed lever 143 mounted, intermediate between its ends, in a fixed bearing element 144, with the arms in different planes of levels. The opposite (upper) arm 145 of the connecting link engages the pointer element in an elongated slot 146 as shown more particularly in FIG. 9. The link or lever 143 may be of heavy-gauge wire bent into the angular form shown, and is thus of low-cost.

The force of the spring 140 serves to hold the link or lever 143 in engagement with the tuning lever 141 (which corresponds to the tuning lever 35 of FIGURES 4 and 6) as the latter moves to preset tune the UHF tuner, as indicated by the dotted lines 147 in FIG. 10. The pointer or indicator 134 is accordingly moved over the channel scale 135. The tuning indicator thus provides for showing approximately the location in the UHF tuning band of the UHF tuner adjustment at any time, thereby to aid in the selection of the desired specific receiving channels for each tuning stop at which a UHF channel is to be substituted for an unused VHF channel.

The indicator shown is by way of example as representing any tuning indicator means providing a wide range of visibility external to the casing and of low-cost, simplified construction. Thus in the present example a few relatively low-cost elements are required and the operating connection with the UHF tuner is provided merely by resiliently engaging the free end of the UHF tuning lever, thereby to receive operation motion and direction throughout the tuning range of the UHF tuner.

From the foregoing description it will be seen that the programming and tuning control system for VHF–UHF television receivers, constructed in accordance with the invention, may be of comparatively low cost and simplified construction, with many of the major parts providing dual operating functions. Furthermore, the twelve VHF channels may be pretuned along with any number of UHF channels, interposed or added, throughout a full 360-degree rotation of a single tuning control shaft for the system, and by which effectively both tuners are moved jointly and in unison to the same stop positions in a rotational sequence in either direction.

The combined two-band tuners provide rotary step-type preset tuning for UHF as well as VHF channels and ready selection under motorized and remote control operation. At each detent-controlled channel tuning stop position, the signal selecting circuits of the receiver are tuned to one of a number of preselected signal receiving channels in either or both bands, intermixed and/or in any desired sequence.

In this system, single rotary turret means is provided for presetting the VHF fine tuning and the tuning of the UHF channels, and programming the band selection at each tuning stop position. One set of adjustable tuning elements or screws may provide not only for operating through any undesired tuning stop, but also for programming all of the other preset tuning and band-switching functions, thereby eliminating all other programming elements.

The system has the further advantage that for remote control or motorized operation, only a single operating motor with a single set of control switches and operating elements are required for both VHF and UHF preset and programmed channel signal selection.

What is claimed is:

1. In a two-band television receiver, the combination with a first tuner having a plurality of tuning stop positions and a continuously tunable second tuner, said first tuner being connected for signal reception to the exclusion of the second tuner, of means for switching said tuners to provide signal reception selectively through the second tuner, a single rotary tuning control shaft for said tuners connected with said first tuner for operation thereof through said tuning stop positions, fine tuning means for said first tuner, means including a single rotary tuning control turret connected with the tuning shaft for presetting said fine tuning means and for tuning said second tuner to predetermined signal channels at different selected tuning stop positions, and means carried by said tuning control turret for programming said switching means to operate at selected tuning stop positions for presetting the second tuner for signal reception.

2. In a two-band television receiver, the combination with a first lower-frequency tuner of the rotary preset channel type having channel tuning stops and a second higher-frequency tuner of the continuously tunable type, said tuners being connected to provide signal reception through the first tuner in the lower-frequency band, of means for switching said tuners to provide signal reception selectively through the second tuner in the higher frequency band, a single rotary tuning control shaft for said tuners connected with said first tuner for operation thereof through said tuning stops, fine tuning means for said first tuner, means including a rotary tuning control turret connected with the tuning shaft for presetting said fine tuning means at selected tuning stops of said first tuner and presetting said second tuner to predetermined signal channels in the higher-frequency band at other selected tuning stops of said first tuner, and means carried by said tuning control turret for programming said switching means to operate at said other selected tuning stops, thereby to provide selective channel tuning in two signal bands in response to rotation of said single tuning control shaft through said channel tuning stops.

3. In a two-band television receiver, the combination with a first lower-frequency tuner of the rotary preset channel type having channel tuning stops and a second higher-frequency tuner of the continuously tunable type, said tuners being connected to provide signal reception through the first tuner in the lower-frequency band, of means for switching said tuners to provide signal reception selectively through the second tuner in the higher-frequency band, a single rotary tuning control shaft for said tuners connected with said first tuner for operation thereof through said tuning stops, detent means connected with said shaft for resiliently holding said tuner at each of said stops, fine tuning means for said first tuner, means including a rotary tuning control turret connected with the tuning shaft for presetting said fine tuning means at selected tuning stops of said first tuner and presetting said second tuner to predetermined signal channels in the higher frequency band at other selected tuning stops of said first tuner, means carried by said tuning control turret for programming said switching means to operate at said other selected tuning stops, single electric motor means connected with said tuning control shaft for driving said shaft between said detent-controlled stops, and a control circuit for said motor means operative to start the tuning shaft for channel change in response to manual and remote control, and to stop said shaft at each of said stops under control of said detent means.

4. In a two-band television receiver, the combination with a first tuner of the rotary preset channel type having channel tuning stops and circuits for signal reception in a lower-frequency television broadcast band and a second tuner of the continuously tunable type for signal reception in a higher-frequency television broadcast band, of a programming and tuning control system therefor comprising;

means for switching said tuners to provide signal reception selectively therethrough, a single rotary tuning control shaft for said system connected with said first tuner for operation thereof through said tuning stops, means including a rotary tuning control turret connected with the tuning control shaft for presetting said second tuner to predetermined signal channels in the higher-frequency band at selected tuning stops of said first tuner, means carried by said tuning control turret for programming said switching means to operate at said selected tuning stops for signal reception through the second tuner, single electric motor means connected with said tuning control shaft for driving said shaft between said stops, and a control circuit for said motor means operative to start and to stop the control shaft at said stops.

5. In a two-band television receiver, the combination with a first tuner of the rotary type having a plurality of channel tuning stop positions connected for preset channel tuning in the very-high-frequency band and a second tuner for continuous tuning on the ultra-high-frequency band, of a programming and tuning control system therefor comprising;

means for switching said tuners to provide signal reception selectively in the ultra-high-frequency band, a single rotary tuning control shaft for said system connected with said first tuner for operation thereof through said tuning stop positions, a rotary tuning control turret connected to rotate with the tuning control shaft, and movable control elements on said turret for selectively presetting said second tuner to predetermined signal channels in the ultra-high-frequency band at a variety of tuning stop positions throughout the tuning sequence of said first tuner and programming said switching means to operate at said variety of tuning stop positions.

6. In a two-band television receiver, the combination as defined in claim 5, wherein single electric motor means is connected with said tuning control shaft for driving said shaft between said stops, and wherein a control circuit for said motor means is provided for starting and stopping the tuning control shaft at said stops.

7. A programming and tuning control system for television receivers of the two-band type, comprising in combination, a lower-frequency tuner of the rotary preset channel type having a plurality of angularly-spaced channel tuning stop positions and channel fine tuning means, a single rotary tuning control shaft for said system connected for moving said tuner through said channel tuning stop positions, a single turret element connected with said tuning shaft to rotate with corresponding stop positions in response to rotary tuning operation of said shaft, said turret element having a circular row of adjustable tuning control elements successively operable by rotation to preset the fine tuning of said lower-frequency tuner at the successive stop positions, a second higher-frequency tuner for said system having a single movable tuning control element for preset channel tuning operation by said turret tuning control elements at selected ones of said successive stop positions, two-position band-switching means operable to provide selective signal reception through said second tuner at each of said selected stop positions, single electric motor means connected with said tuning control shaft for driving said shaft and tuners between said stop positions, and control circuits for said motor, including a single set of control switches, operative to start and stop the control shaft at each of said stop positions.

8. A programming and tuning control system for television receivers of the two-band type, comprising in combination, a lower-frequency tuner of the rotary channel-selector type having a plurality of angularly-spaced tuning stop positions and channel fine-tuning means, a single rotary tuning control shaft for said system connected for moving said tuner through said channel tuning stop positions, a single tuning control turret mounted on and rotatable with said shaft, said turret having tuning control elements adjustable for operating said fine-tuning means to preset the fine tuning of said lower-frequency tuner at the successive stop positions, a second higher-frequency tuner for said system having a movable tuning control element for operation by said turret tuning control elements for tuning to any frequency in the higher frequency band at selected ones of said successive stop positions, two-position band-switching means operable in connection with said turret to provide for programming selective signal reception through said second tuner at each of said selected stop positions, and single electric motor means connected with said tuning control shaft for driving said shaft between said stop positions, thereby to select signal channels in both bands in predetermined sequence through said stop positions with both tuners and single control means therefor.

9. A programming and tuning control system for use in two-band television receivers, comprising,
   a first lower-frequency tuner of the rotary preset-channel type having channel tuning stops and channel fine-tuning means including a movable control element,
   a second higher-frequency tuner having a movable tuning control element for tuning throughout the higher frequency band,
   means for switching said tuners to provide signal reception selectively therethrough,
   a single rotary tuning control shaft for said tuners connected with said first tuner for operation thereof through said tuning stops,
   a single rotary tuning control turret connected with the tuning shaft for rotation therewith to said stops,
   means carried by said turret for operating said movable tuning control elements to preset said fine tuning means and to preset said second tuner to predetermined signal channels in the higher-frequency band at different tuning stops other than those selected for preset fine tuning and for programming said switching means to operate at different ones of said tuning stops,
   single electric motor means connected with said tuning control shaft for driving said shaft between said tuning stops and controlling the channel tuning in both bands, and
   a control circuit for said motor means operative to stop the tuning shaft at each of said stops and to start said motor means to initiate a channel change,
   said control circuit including manual and remote signal-responsive switch means.

10. In a two-band television receiver, the combination with a first tuner and a second tuner, said first tuner being of the rotary preset channel type having a plurality of channel tuning stops and connected for signal reception to the exclusion of the second tuner of
   means for switching said tuners to provide signal reception selectively through the second tuner,
   a single rotary tuning control shaft for said tuners connected with said first tuner for operation thereof through said tuning stops,
   fine tuning means for said first tuner,
   a single rotary control turret connected with the tuning shaft for rotation therewith to said stops, and
   variable programming and control means carried by said turret and movable therewith for selectively presetting said second tuner to predetermined signal channels at any tuning stops in the channel-tuning sequence of the first tuner, and programming said switching means to operate at any of said tuning stops.

11. In a two-band television receiver, the combination as defined in claim 10, wherein said programming and control means includes a circular row of axially-adjustable tuning control elements movable to different individual positions of adjustment for effecting said programming and control functions, and for presetting said fine tuning means at other than said selected tuning stops.

12. In a two-band television receiver, the combination with a first lower-frequency tuner of the rotary preset channel type having channel tuning stops, of
   a second higher-frequency tuner,
   said tuners being connected to provide signal reception in the lower-frequency band,
   means for switching said tuners to provide signal reception selectively through the second tuner in the higher-frequency band,
   a single rotary tuning control shaft for said tuners connected with said first tuner for operation thereof through said tuning stops,
   fine tuning means for said first tuner jointly operable with said second tuner, a rotary tuning control turret connected with the tuning shaft for rotation therewith to said stops, and
   means including a circular row of threaded tuning screws carried by said turret and axially adjustable to preset said fine tuning means for the lower-frequency band and said second tuner to predetermined signal channels in the higher-frequency band at different selected tuning stops of said first tuner, and to program said switching means to operate at selected tuning stops with said second tuner.

13. In a two-band television receiver, the combination as defined in claim 12, wherein means are provided in said turret for guiding and supporting said tuning screws at opposite ends of the thread thereof, and wherein spring means are provided on said turret for engaging and resiliently biasing said tuning screws to move into threaded connection with the turret at opposite ends of the axial movement of said screws.

14. In a two-band television receiver, the combination with a first tuner of the rotary preset channel type having channel tuning stops and circuits for signal reception in a lower-frequency television broadcast band and a second tuner for signal reception in a higher-frequency television broadcast band,
   of a programming and tuning control system therefore comprising;
   means for switching said tuners to provide signal reception selectively therethrough,
   a single rotary tuning control shaft for said system connected with said first tuner for operation thereof through said tuning stops,
   a single detent means for the system connected with said tuning control shaft for resiliently holding said shaft at each of said stops,
   rotary turret means connected with the tuning control shaft for presetting said second tuner to predetermined signal channels in the higher-frequency band at selected tuning stops and for programming said switching means to operate at said selected tuning stops for signal reception through the second tuner,
   single electric motor means connected with said tuning control shaft for driving said shaft between said detent-controlled stops,
   a control circuit for said motor means operative to energize the motor means and start the tuning shaft for channel change in response to manual and remote control, and deenergize the motor means and stop said shaft at each of said stops under control of said detent means, and
   a starting control switch for said motor means in the control circuit selectively operable by said turret means to program through unused tuning stops.

15. In a two-band television receiver, the combination with a first lower-frequency tuner of the rotary preset channel type having channel tuning stops and a second higher-frequency tuner, said tuners being connected to provide signal reception through the first tuner in the lower-frequency band, of
   means for switching said tuners to provide signal reception selectively through the second tuner in the higher-frequency band,
   a single rotary tuning control shaft for said tuners connected with said first tuner for operation thereof through said tuning stops,
   detent means connected for resiliently holding said shaft at each of said stops,
   fine tuning means for said first tuner,
   a rotary tuning control turret connected with the tuning shaft for rotation and stopping therewith,
   means including a circular row of adjustable control elements on said turret selectively operable for presetting said fine tuning means at selected tuning stops and for presetting said second tuner to predetermined signal channels in the higher-frequency band and programming said switching means to operate at other selected tuning stops, single electric motor means connected with said tuning control shaft for driving said shaft between said detent-controlled stops, a control circuit for said motor means operative to energize the motor means and start the tuning shaft for channel change in response to manual and remote control, and to deenergize the motor means and stop said shaft at each of said stops under control of said detent means, and a starting control switch for said motor means in the control circuit selectively operable by said turret control elements at other than said selected tuning stops, thereby to program through unused tuning stops.

16. In a two-band television receiver, the combination with a first lower-frequency tuner of the rotary preset channel type having channel tuning stops, of a second higher-frequency tuner having a tuning control lever pivoted to move at one end through a predetermined range covering the higher-frequency band of the receiver, said tuners being connected to provide signal reception in the lower-frequency band, means for switching said tuners to provide signal reception selectively through the second tuner in the higher-frequency band, a single rotary tuning control shaft for said tuners connected with said first tuner for operation thereof through said tuning stops, fine tuning means for said first tuner having a movable tuning control lever jointly operable with the tuning control lever of said second tuner, a rotary control turret connected with the tuning shaft for rotation therewith to said stops, and a plurality of control elements on said turret operable to engage and move said tuning control levers and preset said fine tuning means for the lower-frequency band and said second tuner to predetermined signal channels in the higher-frequency band at different selected tuning stops, and to program said switching means to operate at said selected preset tuning stops for said second tuner.

17. In a two-band television receiver, the combination as defined in claim 16, wherein tuning indicator means are provided, including a visible dial having a calibrated scale covering the higher-frequency band of the receiver and a pointer element for the scale operatively connected for movement by the tuning control lever of the second tuner.

18. In a two-band television receiver, the combination as defined in claim 16, wherein tuning indicator means are provided, including a visible dial having a calibrated scale covering the higher-frequency band of the receiver and pointer element for the scale operatively connected for movement by the tuning control level of the second tuner, and wherein the operative connection between the pointer element and the tuning control lever is provided by two-arm lever means pivoted intermediate between its ends and operating in two planes with one arm engaging the pointer element and the other arm engaging the tuning control lever.

19. In a two-band television receiver, the combination as defined in claim 16, wherein tuning indicator means are provided, including a first visible dial having a calibrated scale covering the higher-frequency band of the receiver and a pointer element for the scale operatively connected for movement by the tuning control lever of the second tuner, and a second visible dial of the rotary type connected to rotate with said tuning control shaft and adapted for selective channel indication in either band at each tuning stop.

20. A programming and tuning control system for television receivers of the two-band type, comprising in combination, a lower-frequency tuner of the rotary channel-selector type having fine tuning means and a plurality of angularly-spaced tuning stop positions, a single rotary tuning control shaft for said system connected with said tuner, a single turret element connected with said tuning shaft to rotate with corresponding stop positions in response to rotary tuning operation of said shaft, said turret element having a circular row of tuning control elements individually adjustable by rotation to preset the fine tuning of said lower-frequency tuner at each successive stop position, manually operable means for engaging and rotating said tuning control elements to provide tuning adjustment thereof at the successive stop positions, said last named means including a single rotatable and axially-movable manual control shaft for the system, a second higher-frequency tuner for said system having a movable tuning control element for preset channel tuning operation by said turret tuning control elements at selected ones of said successive stop positions, two-position band-switching means for selective signal reception through said second tuner at each selected tuning stop position, an automatic-frequency-control circuit for said second tuner having a cut-off switch, single electric motor means connected with said tuning control shaft for driving said shaft and tuners between said stop positions, control circuits for said motor, including a single set of control switches operative to start and stop the tuning control shaft at each of said stop positions, one of said switches being connected for operation by axial movement of said manual control shaft in one direction and by selected individual tuning control elements in predetermined positions of adjustment for starting said tuning shaft, and means connected with said manual control shaft for operating said manual control shaft for operating said automatic-frequency-control cut-off switch in response to axial movement of said manual control shaft in the opposite direction.

21. In a two-band television receiver, the combination with a first lower-frequency tuner of the rotary preset channel type having channel tuning stops and a second higher-frequency tuner, said tuners being connected to provide signal reception through the first tuner in the lower-frequency band, of means for switching said tuners to provide signal reception selectively through the second tuner in the higher-frequency band, an automatic-frequency-control circuit for said second tuner having a cut-off switch, a single rotary tuning control shaft for said tuners connected with said first tuner for operation thereof through said tuning stops, detent means connected for resiliently holding said shaft at each of said stops, a rotary tuning control turret connected with the tuning shaft for rotation and stopping therewith, means including a circular row of adjustable control elements on said turret selectively operable for presetting said second tuner to predetermined signal channels in the higher-frequency band and programming said switching means to operate at other selected tuning stops, manually operable means for engaging and rotating said tuning control elements to provide tuning adjustment thereof at the successive stop positions, said last named means including a single rotatable and axially-movable manual control shaft for the system, single electric motor means connected with the tuning control shaft for driving said shaft between said detent-controlled stops, a control circuit for said motor means operative to energize the motor means and start the tuning shaft for channel change in response to manual and remote control, and to deenergize the motor means and stop said shaft at each of said stops under control of said detent means, a starting control switch for said motor means in the control circuit selectively operable by said turret control elements at other than said selected tuning stops, thereby to program through unused tuning stops, and means for operating said automatic-frequency-control cut-off switch in response to axial movement of said manual control shaft in one direction for presetting the tuning of said system and for operating said starting control switch in response to axial movement of said manual control shaft in the opposite direction.

22. A tuning system for a television receiver comprising:

a step-by-step very high frequency television tuner including a rotatable tuning control element having a plurality of stop positions for selecting television channels in the very high frequency television band, a rotatable tuning control shaft coupled to said tuning control element, a turret mounted on said rotatable control shaft, a continuously tunable ultra high frequency television tuner having a continuously rotatable tuning control shaft for selecting television channels in the ultra high frequency television band, a plurality of presettable adjustable means on said turret, means coupling said adjustable means to the continuously rotatable tuning control shaft of said ultra high frequency television tuner thereby presetting said ultra high frequency tuner to select a particular ultra high frequency channel in acordance with the setting of said adjustable means, and switching means coupled with said very high frequency tuner and said ultra high frequency tuner for establishing only one or the other of said tuners at a time as the television channel selecting means for said television receiver.

References Cited by the Examiner

UNITED STATES PATENTS

| | | | |
|---|---|---|---|
| 2,668,235 | 2/1954 | Nordby ----------- | 334—49 X |
| 2,873,610 | 2/1959 | Williams ----------- | 334—1 X |
| 2,989,627 | 6/1961 | Silvey ------------ | 321—461 |
| 3,069,638 | 12/1962 | Lindeman et al. ----- | 334—51 |

ROBERT H. ROSE, *Primary Examiner.*

DAVID G. REDINBAUGH, *Examiner.*